US010819302B1

(12) United States Patent
Srinivasan et al.

(10) Patent No.: US 10,819,302 B1
(45) Date of Patent: Oct. 27, 2020

(54) AUTOMATIC GAIN CONTROL TO OPTIMIZE RECEIVER PERFORMANCE IN PRESENCE OF JAMMER SIGNALS

(71) Applicant: NXP B.V., Eindhoven (NL)

(72) Inventors: Radha Srinivasan, Irvine, CA (US); Brima Babatunde Ibrahim, Laguna Hills, CA (US); Edward Youssoufian, Irvine, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/530,554

(22) Filed: Aug. 15, 2019

(51) Int. Cl.
*H04K 3/00* (2006.01)
*H03G 3/30* (2006.01)
*H03F 3/30* (2006.01)

(52) U.S. Cl.
CPC ......... *H03G 3/3036* (2013.01); *H03F 3/3052* (2013.01); *H03G 3/3078* (2013.01); *H04K 3/22* (2013.01)

(58) Field of Classification Search
CPC .. H03G 3/3036; H03G 3/3078; H03F 3/3052; H04K 3/22; H04K 375/345
See application file for complete search history.

(56) References Cited

U.S. PATENT DOCUMENTS

| | | | |
|---|---|---|---|
| 6,420,934 B1 | 7/2002 | Butler et al. | |
| 9,264,280 B1 | 2/2016 | Waheed et al. | |
| 9,608,587 B2 | 3/2017 | Waheed et al. | |
| 2009/0149198 A1 | 6/2009 | Nam et al. | |
| 2010/0329321 A1* | 12/2010 | Avellone | H04B 1/0007 375/227 |
| 2014/0029128 A1* | 1/2014 | Zhang | H03G 3/3052 360/46 |
| 2017/0123039 A1 | 5/2017 | Shin et al. | |
| 2018/0045807 A1 | 2/2018 | Senna et al. | |

* cited by examiner

*Primary Examiner* — Ted M Wang (57) ABSTRACT

A communication system including an analog front end and an automatic gain controller. The analog front end includes at least one amplifier for amplifying a received analog signal and an analog to digital converter that converts the analog signal to digital samples. The automatic gain controller includes comparator circuitry, counter circuitry, and a gain controller. The comparator circuitry compares each of the digital samples with an upper threshold and a lower threshold. The counter circuitry counts a high count number of the digital samples having magnitudes that are greater than the upper threshold during each count window and counts a low count number of the digital samples having magnitudes that are less than the lower threshold during the count window. The gain controller adjusts a gain of the at least one amplifier by an amount based on the high count number and the low count number.

20 Claims, 4 Drawing Sheets

AUTOMATIC GAIN CONTROL TO OPTIMIZE RECEIVER PERFORMANCE IN PRESENCE OF JAMMER SIGNALS

BACKGROUND

Field of the Invention

The present invention relates in general to automatic gain control in a communication system, and more particularly to a communication system including a receiver and an automatic gain controller for adjusting gain of an analog front end of the receiver for optimizing reception of a desired signal in the presence of jammer signals.

Description of the Related Art

In a conventional communication system, an automatic gain control (AGC) loop (or automatic gain controller) uses one or more analog level detectors to determine a relative strength or amplitude of a received signal in order to control the gain of one or more amplifiers of an analog front end. The gain is controlled in an attempt to adjust the amplitude of a desired signal to be within a dynamic range of an analog to digital converter of the communication system to successfully detect and capture the desired signal. Ultra Wide Band (UWB) is a pulse-based communication system. In many communication systems including conventional UWB systems, the AGC must cope with several different types of "jammers" or interfering wireless signals that include frequencies that overlap or that are otherwise adjacent to the frequency range of the desired UWB signal. Jammer signals include, for example, spurs, long-term evolution (LTE) signals, continuous wave (CW) signals, wireless local area network (WLAN) signals, etc., including jammer signals with high peak-to-average power ratios (PAPRs). The presence of jammer signals tends to reduce the performance of the receiver while attempting to acquire a desired signal.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

The inventors have recognized that the performance of the receiver of a communication system is reduced in the presence of jammer signals including jammer signals with high peak-to-average power ratios (PAPRs). This includes pulse-based communication systems including UWB systems and the like. They have therefore developed a communication system including a receiver with an automatic gain controller (AGC) that adjusts the gain of an analog front end of the receiver to optimize reception of a desired signal in the presence of jammer signals. The AGC counts the in-phase (I) and quadrature (Q) phase digital samples at the output of the analog-to-digital converter (ADC) that are above an upper threshold and that are below a lower threshold for each count window during signal reception. The upper and lower thresholds are selected based on a dynamic range of the ADC. These high and low count values are used to either increase or decrease gain in order to optimize the signal-to-noise ratio (SNR) in the presence of jammer signals. The AGC adapts to the nature of the jammer signal to provide the best SNR for the wanted signal, which is maintained along with the jammer signal in the linear range to avoid undesirable non-linear effects. Essentially, the AGC controls the gain of the analog front end of the receiver to maximize the dynamic range and sensitivity for desired signal reception while ensuring that any jammer signal that is present does not saturate the analog front end.

Figure 1:
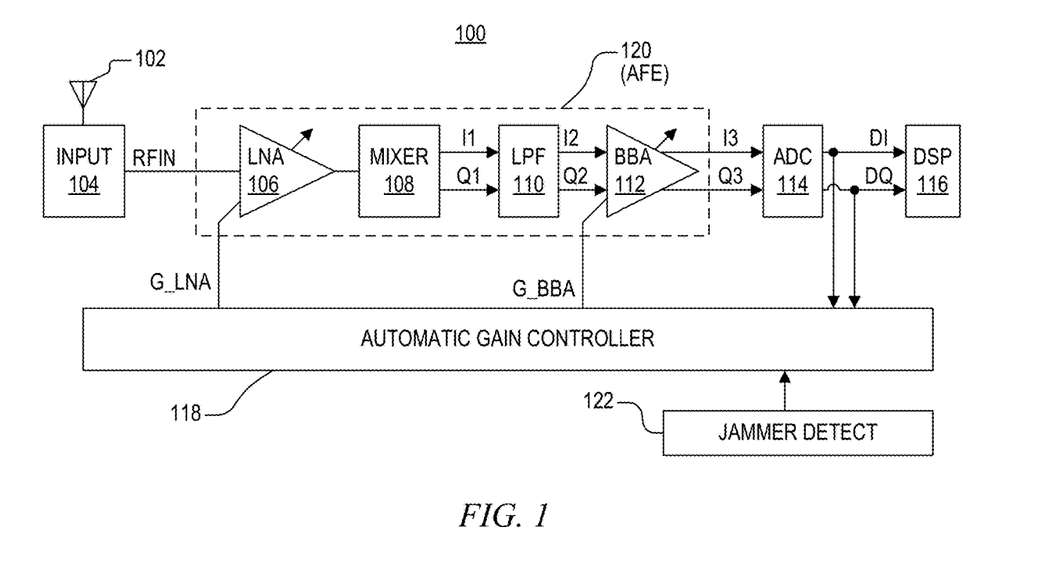
FIG. 1 is a simplified block diagram of a communication system implemented according to one embodiment of the present disclosure.

FIG. 1 is a simplified block diagram of a communication system 100 implemented according to one embodiment of the present disclosure. An antenna 102 coupled to an input circuit 104 provides a received radio frequency (RF) input signal (RFIN) to an input of a low-noise amplifier (LNA) 106. The input circuit 104 may include various electronic components depending upon the particular configuration which are not further described, such as a matching network (not shown), a passive gain network (not shown), filter circuitry (not shown), one or more amplifiers (not shown), etc. The LNA 106 has an output coupled to an input of a mixer 108, which has a pair of outputs providing an in-phase (I) signal I1 and a corresponding quadrature phase signal Q1. Although not shown, a local oscillator or the like may provide an oscillation signal to the mixer 108 to step down the RF frequency to an intermediate frequency (IF) or directly to a baseband frequency (BBF). The I1 and Q1 signals are provided to respective inputs of a low pass filter (LPF) 110, which provides corresponding filtered in-phase and quadrature phase signals I2 and Q2 to respective inputs of a base-band amplifier (BBA) 112. The BBA 112 outputs corresponding in-phase and quadrature phase signals I3 and Q3 to respective inputs of an analog-to-digital converter (ADC) 114, which provides corresponding in-phase and quadrature phase digital signals DI and DQ to corresponding inputs of a digital signal processor (DSP) 116.

The DI and DQ signals are provided in the form of digital samples that sample the I3 and Q3 analog input signals at a selected sampling rate. In one embodiment, the DI and DQ signals have a bandwidth of about 500 Megahertz (MHz), in which case the sampling rate may be about 1 Gigahertz (GHz). The sampling rate may be different depending upon the frequency and bandwidth of the input signal.

The DI and DQ signals are provided to respective inputs of an automatic gain controller (AGC) 118, which provides a first gain control signal G_LNA to control the gain of the LNA 106 and a second gain control signal G_BBA to control the gain of the BBA 112. The LNA 106, the mixer 108, the LPF 110 and the BBA 112 are part of an analog front end (AFE) 120 of the communication system 100. The AFE 120 of the communication system 100 is shown in simplified form and including two gain stages (e.g., LNA 106 and BBA 112) in which additional components and gain or amplifier stages may be included. For example, one or more transimpedance amplifiers, buffer amplifiers, filters, etc., may be included within the AFE 120. Although the AGC 118 is only shown controlling 2 gain stages including the LNA 106 and the BBA 112, any number of controllable gain stages (e.g., one or more amplifiers or gain stages) may be included and controlled by the AGC 118. The gain of each amplifier or gain stage in the AFE 120 may be controlled by the AGC 118 to amplify, buffer, or attenuate the analog signal to control the amplitude or magnitude of the signals 13 and Q3 at the front end of the ADC 114.

The DSP 116 generally represents the digital portion of the communication system 100 for extracting the received signal and may include various digital processing circuits (not shown). For example, additional digital circuits may be included, such as, for example, a digital or channel filter or the like, a received signal strength indication (RSSI) circuit or the like, etc. The DSP 116 may incorporate a microcontroller or a processor or other digital control circuitry depending upon the particular configuration, and is not further described. The communication system 100 may be a transceiver circuit further including a transmitter portion coupled to the antenna 102, but is not shown or described.

In one embodiment, the communication system 100 is configured for receiving and successfully demodulating transmitted Ultra Wide Band (UWB), pulse-based signals, such as those according to the IEEE 802.15.4 technical standard or the like. The communication system 100 may be located in an environment in which any one or more of several different types of "jammers" or jammer signals coincident with the desired UWB signals. Jammer signals include, for example, spurs, long-term evolution (LTE) signals, continuous wave (CW) signals, wireless local area network (WLAN) signals, etc. As described further herein, the AGC 118 is configured to adjust the gain of the AFE 120 with or without such jammer signals to achieve the highest signal-to-noise ratio (SNR) of the desired UWB signal as possible. It is appreciated, however, that the present invention is not limited to UWB signals and may be used for other types of wired or wireless signals and the like. A jammer detect circuit 122 collectively represents other portions of the communication system 100 used to detect the presence of jammer signals in the communication medium. Operation of the AGC 118 may be adjusted based on whether a jammer signal is detected and the type of jammer signal if and when detected.

Figure 2:
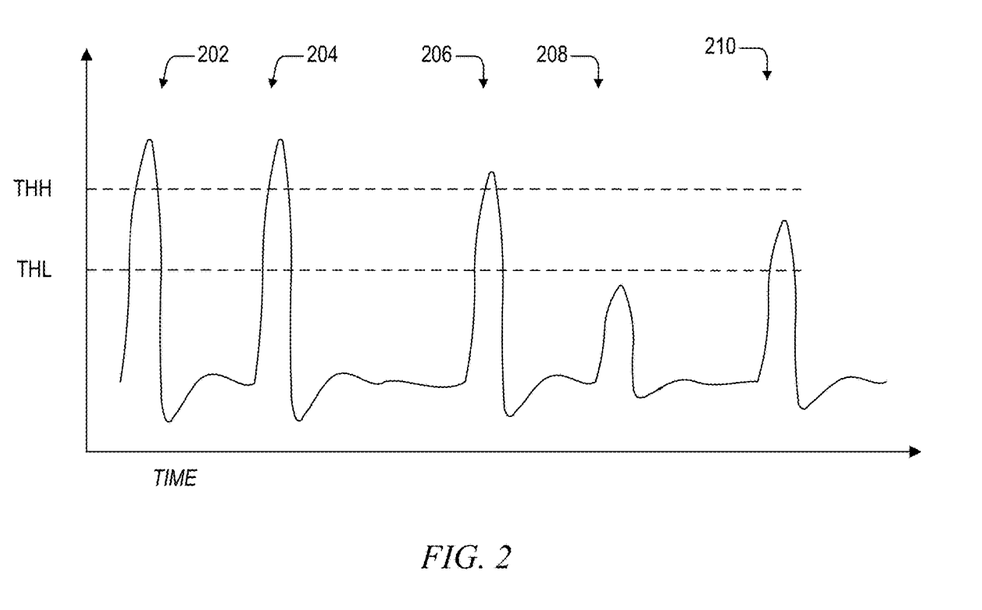
FIG. 2 is a graphic diagram generally illustrating gain adjustment of the AFE of FIG. 1 to adjust the magnitude of peaks of an input UWB signal based on an upper threshold THH and a lower threshold THL.

FIG. 2 is a graphic diagram generally illustrating gain adjustment of the AFE 120 to adjust the magnitude of peaks of an input UWB signal based on an upper threshold THH and a lower threshold THL. The two thresholds THL and THH may each be programmable and are selected based on a dynamic range of the ADC 114. The AGC 118 initially sets the gain of the AFE 120 at a maximum level to ensure detection of weak input signals. As shown in FIG. 2, for example, the input signal may initially include a pair of pulses shown at 202 and 204, each having peaks that rise above the upper threshold THH since the analog gain is initially set too high. The AGC 118 monitors the DI and DQ signals, detects samples above THH, and adjusts G_LNA and G_BBA (and any other gain control values) to reduce the gain of the AFE 120. A subsequent pulse shown at 206 has a peak that is attenuated based on reduction of the analog gain, but the peak still exceeds THH. As the gain is further reduced, a subsequent pulse shown at 208 is significantly attenuated so that its peak level does not even reach the lower threshold THL. In response, the AGC 118 increases the analog gain so that a subsequent pulse shown at 210 has a peak level that is between THL and THH. In one embodiment, the difference between THL and THH is at least a gain step of the AFE 120 as controlled by the AGC 118 plus a margin amount to achieve hysteresis to avoid oscillation of the AGC control loop. In one embodiment, the gain step is 2 decibels (dB).

Figure 3:
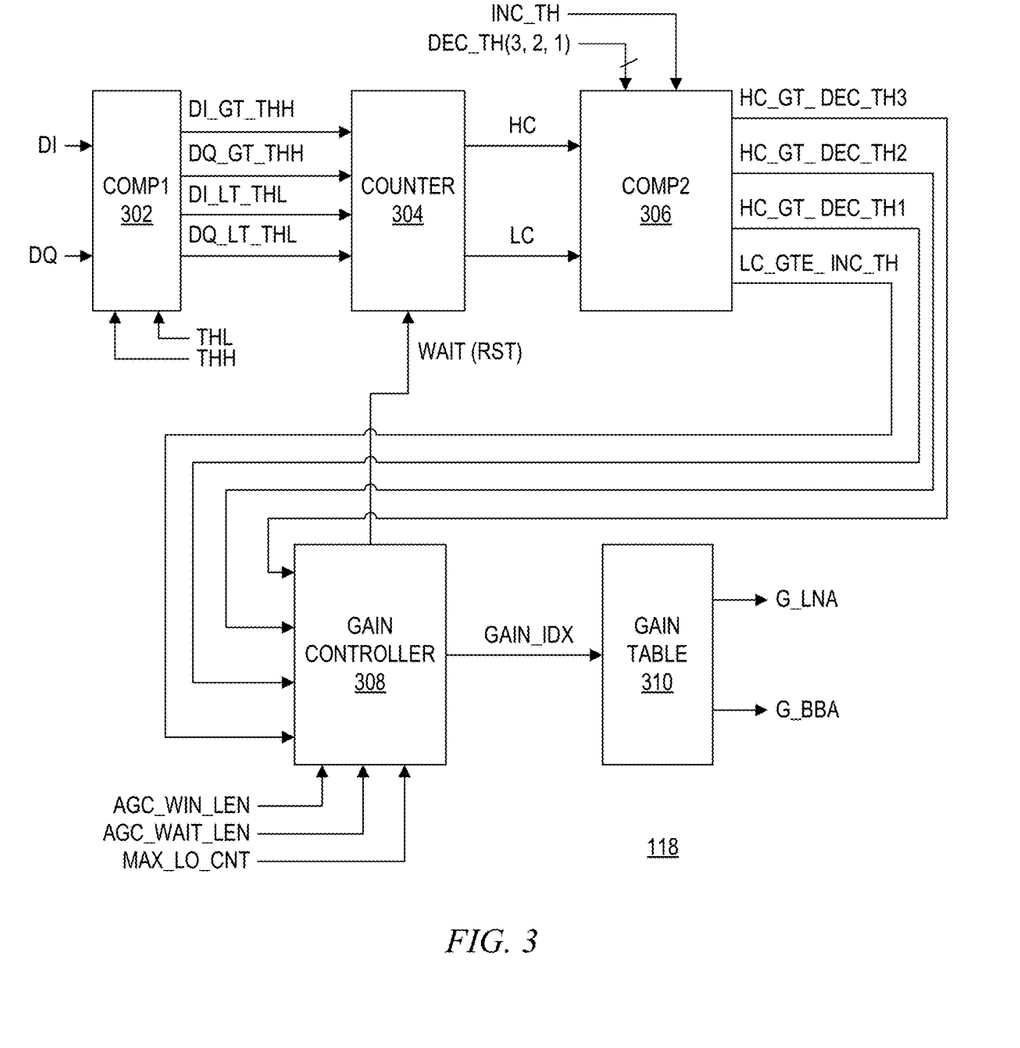
FIG. 3 is a simplified block diagram of the AGC of FIG. 1 according to one embodiment of the present disclosure.

FIG. 3 is a simplified block diagram of the AGC 118 according to one embodiment of the present disclosure. The DI and DQ signals are provided to respective inputs of a first digital comparator (COMP1) 302, which also receives the THL and THH thresholds. The COMP1 302 compares the magnitude of each digital sample of the DI and DQ signals with the digital threshold values THL and THH and develops four different signals. A first signal DI_GT_THH is asserted to a logic high level (e.g., logic "1") when the absolute value or magnitude of a sample of DI is greater than the upper threshold THH, or |DI|>THH, a second signal DQ_GT_TH is asserted to logic high when the absolute value or magnitude of a sample of DQ is greater than the upper threshold THH, or |DQ|>THH, a third signal DI_LT_THL is asserted to logic high when the absolute value or magnitude of a sample of DI is less than the lower threshold THL, or |DI|<THL, and a fourth signal DQ_LT_THL is asserted to logic high when the absolute value or magnitude of a sample of DQ is less than the lower threshold, or THL |DQ|<THL. These four comparison signals are provided to respective inputs of a counter circuit 304, which counts the number of samples meeting the respective threshold conditions. Thus, the counter 304 counts the number of DI samples and the number of DQ samples having a magnitude above THH, in which the in-phase and quadrature phase samples are counted separately and added together to provide a high count (HC) value. Also, the counter 304 counts the number of DI samples and the number of DQ samples having a magnitude below THL, in which the in-phase and quadrature phase samples are counted separately and added together to provide a low count (LC) value. It is noted that the high count HC and low count LC values are determined for each of multiple count windows as further described herein.

The HC and LC values are provided to respective inputs of a second comparator (COMP2) 306, which also receives three different gain decrease thresholds DEC_TH3, DEC_TH2, and DEC_TH1, and further receives a gain increase threshold INC_TH. DEC_TH3 is a high count threshold, DEC_TH2 is a mid count threshold that is less than the high count threshold, and DEC_TH1 is a low count threshold that is less than the mid count threshold. COMP2 306 asserts a signal HC_GT_DEC_TH3 when HC is greater than DEC_TH3, asserts a signal HC_GT_DEC_TH2 when HC is greater than DEC_TH2, asserts a signal HC_GT_DEC_TH1 when HC is greater than DEC_TH1, and asserts a signal LC_GTE_INC_TH when LC is greater than or equal to INC_TH. These four signals are provided to a gain controller 308, which provides a reset signal WAIT to the counter 304. The gain controller 308 also receives a window count value AGC_WIN_LEN which determines a window length of each count window for comparing and counting samples, a value AGC_WAIT_LEN which determines a wait time between sequential count windows (such as to allow for gain settling when the gain is changed), and a value MAX_LO_CNT which determines a number of consecutive count windows in which the low count LC is greater than or equal to the INC_TH.

The gain thresholds DEC_TH3, DEC_TH2, DEC_TH, and INC_TH may each be programmable values. Each gain threshold may either be set for a given configuration or operating scenario or may be dynamically adjusted during operation, such as to improve operating performance.

The AGC_WIN_LEN value defines the length of the count window in terms of the number of sample periods of the ADC 114. The AGC_WIN_LEN value may be a programmable value in which the length of the count window may be adjusted either for a given configuration or operating scenario or which may be dynamically adjusted during operation, such as to improve operating performance The AGC_WAIT_LEN is a programmable value that defines a default wait time between sequential count windows to allow for gain settling when the gain is changed. The gain controller 308 asserts WAIT to hold the counter 304 in reset during each intermediate wait period between count windows, and then de-asserts WAIT to release the counter 304 to count samples for the next count window. The actual wait time may be adjusted as further described herein depending upon any one or more of several factors, such as the settling time of the gain change, the amount of gain change, etc. The wait period may be bypassed between consecutive count windows if the gain remains unchanged.

The gain controller 308 uses the received information, as further described herein, to set and adjust a gain index value GAIN_IDX provided to a gain table 310, which outputs the gain values G_LNA and G_BBA to set the gain of each gain stage of the AFE 120. The gain table 310 may be a memory configured as a lookup table or the like which provides a set of gain values for each index value. In one embodiment, the gain table 310 is configured to set a maximum gain of the AFE 120 when GAIN_IDX is at a maximum value MAX_GAIN_IDX, and to set a minimum gain of the AFE 120 when GAIN_IDX is at a minimum value MIN_GAIN_IDX. Each increment of GAIN_IDX from MIN_GAIN_IDX to MAX_GAIN_IDX increases the gain by a predetermined gain step. The gain step maybe 2 dB or any suitable gain step depending upon the particular configuration. It is noted that each sequential gain step may change one or more of the gain values for each gain change. For example, only one of G_LNA or G_BBA may be adjusted, or one may be increased while the other decreased, etc. In one embodiment, the gain table 310 may be conceptualized as including rows and columns, in which GAIN_IDX accesses a particular row and in which each row provides a corresponding set of gain values for a corresponding gain index GAIN_IDX.

In one embodiment, the gain table 310 is configured to cover the entire range of gain values and the difference between two entries provides the minimum gain change possible for the given configuration, which is the gain step. The gain table 310 can be used to distribute the gain across several gain stages for better noise figure or for better linearity. In one embodiment, increasing the gain index increases the gain and decreasing the gain index decreases the gain of the AFE 120. In one embodiment, multiple gain tables may be included and dynamically switched to achieve desired results, such as, for example, a first gain table for providing better noise figure and a second gain table for providing better linearity. For simplicity of illustration, only a single gain table 310 is shown.

In summary of operation, the gain controller 308 initially sets GAIN_IDX to MAX_GAIN_IDX to set the AFE 120 at its highest gain level to detect weak signals. The gain controller 308 de-asserts WAIT to begin each count window to begin counting the DI and DQ samples, in which the duration of the count window is determined by AGC_WIN_LEN. As a signal is being received and processed through the AFE 120, the ADC 114 converts the analog signal to digital samples on the DI and DQ signals. COMP1 302, which is synchronized with the ADC 114, generates the comparison signals identifying when the magnitudes of the DI or DQ samples are above THH or below THL. The counter 304 generates the high count HC which is the total number of DI and DQ samples having a magnitude greater than THH, and generates the low count LC which is the total number of DI and DQ samples having a magnitude less than THL.

COMP2 compares HC with 3 different gain thresholds DEC_TH3, DEC_TH2, and DEC_TH1 for determining whether and by how much to decrease the gain, and compares LC with a gain threshold INC_TH for determining whether to increase the gain. The three different gain decrease thresholds DEC_TH3–DEC_TH1 determine how much to decrease the gain (by a multiple of the minimum gain step), which enables the loop to settle more quickly when a high number of large samples are detected. In the illustrated embodiment, a single gain increase threshold INC_TH is used. Although it is possible to have several thresholds for gain increment, it is typically unnecessary and may result in oscillation in the presence of jammer signals with high peak to average power ratios (PAPRs). Since the AGC 118 may operate in the presence of LTE or WLAN jammers with high PAPR, the rate of gain increment can be further reduced by observing the low count LC over multiple count windows, determined by the programmable MAX_LO_CNT value, before increasing the gain. In alternative embodiments, multiple gain increase thresholds may be defined and incorporated.

At the end of each count window, the gain controller 308 determines whether to adjust the gain and adjusts GAIN_IDX accordingly. If the gain controller 308 adjusts GAIN_IDX to adjust gain, it asserts WAIT for a sufficient period of time to allow gain settling before beginning a new count window. If no gain adjustment occurs, then a new window count may be started without a wait period. If HC goes higher than DEC_TH3 before a count window is completed, the window may be terminated early to make a large gain reduction to enable faster gain adjustment and AGC loop settlement.

Figure 4:
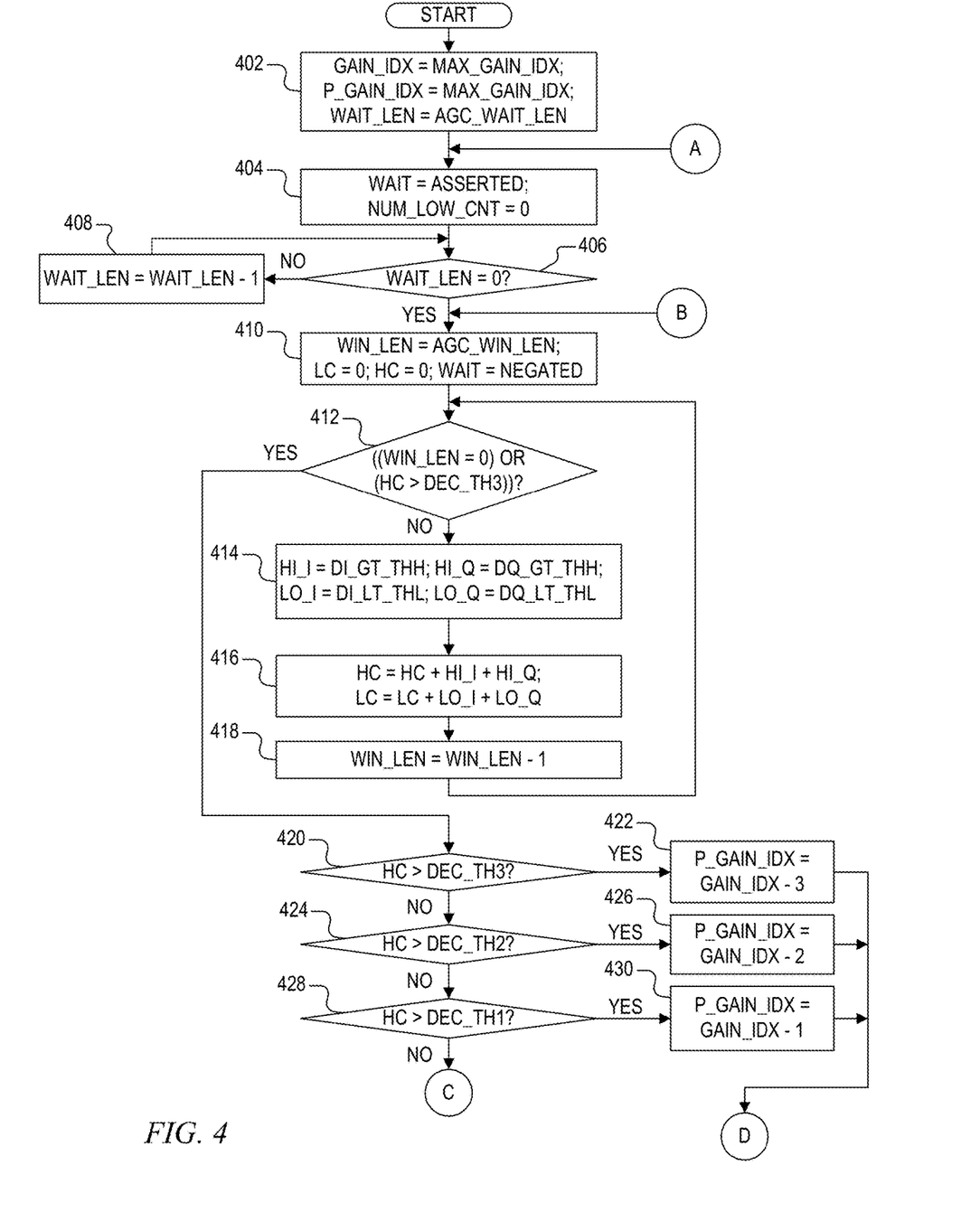
FIGS. 4 and 5 collectively show a flowchart diagram that illustrates operation of the AGC of FIG. 1 according to one embodiment of the present disclosure.
Figure 5:
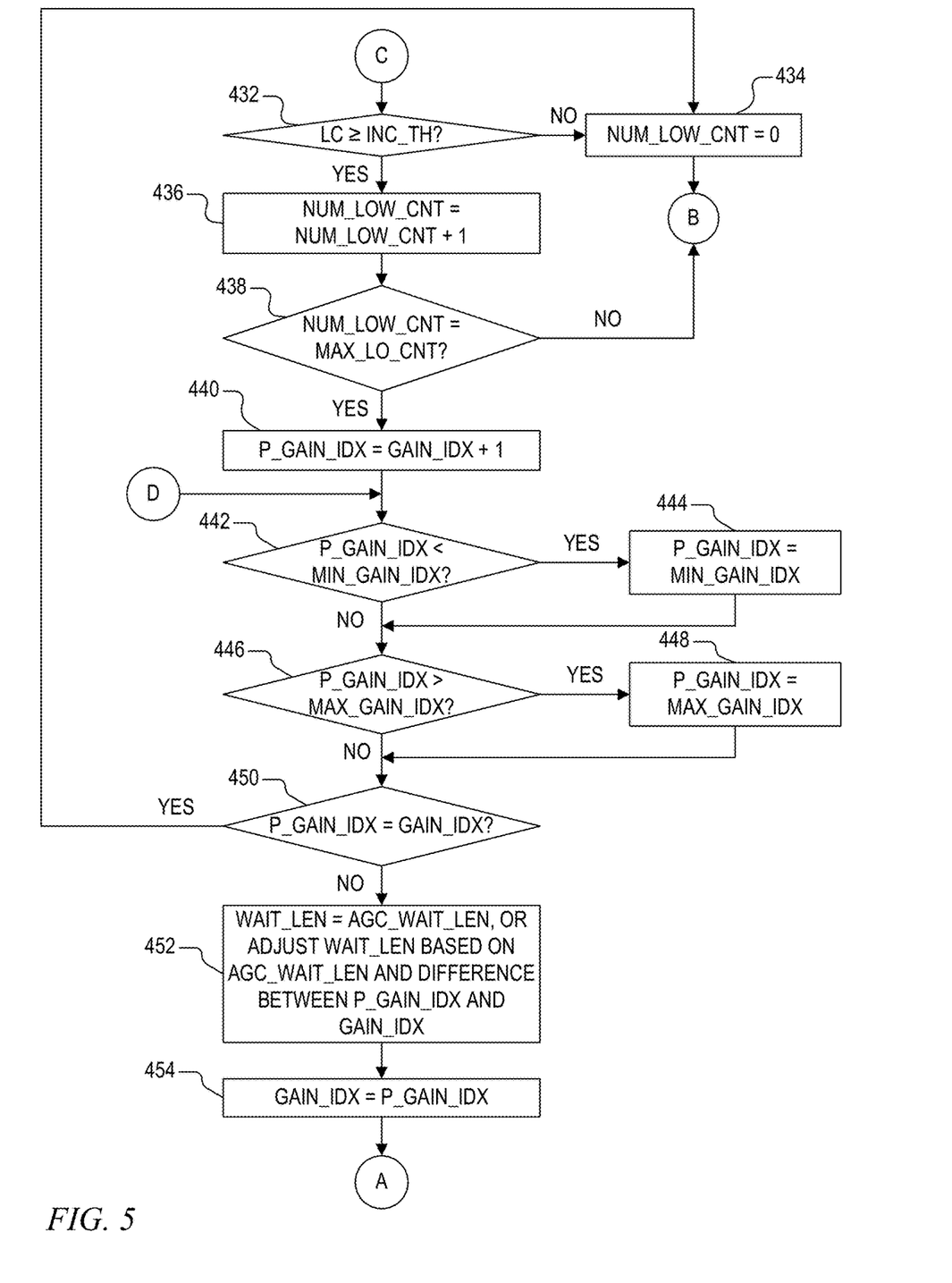

FIGS. 4 and 5 collectively show a flowchart diagram that illustrates operation of the AGC 118 according to one embodiment of the present disclosure. After power on or reset (POR), or between communication sessions, operation transitions to a first block 402 in which GAIN_IDX is set to the maximum value MAX_GAIN_IDX so that the AFE 120 is set to its highest gain level for detecting weak signals. A preliminary gain index value P_GAIN_IDX is also set to MAX_GAIN_IDX and is used for adjusting GAIN_IDX as further described herein. Also, a count window delay or wait value WAIT_LEN is set to AGC_WAIT_LEN before beginning a new count window. Operation transitions to block 404 in which the WAIT signal provided by the gain controller 308 is asserted to hold the counter 304 in reset before starting the next count window. A value NUM_LO_CNT is set to zero (0), which is used to count the number of count windows in which the low count LC is greater than or equal to the INC_TH threshold before increasing the gain as further described herein. Operation then proceeds to query block 406 to inquire whether WAIT_LEN is equal to zero. Initially, since WAIT_LEN is initialized to AGC_WAIT_LEN which is assumed to be a non-zero value, the result is false and operation proceeds to block 408 in which WAIT_LEN is decremented by one. Operation loops between blocks 406 and 408 until WAIT_LEN is decremented to zero to implement a wait period to settle the gain loop assuming that the gain of the AFE 120 has been changed.

When the wait period is completed, operation advances to block 410 in which a value WIN_LEN is set equal to AGC_WIN_LEN to determine an initial window length for comparing and counting samples. Also, the low count LC and high count HC values are each initialized to zero and the WAIT signal is negated to allow the counter 304 to begin counting samples based on the conditions established by COMP1 302 as previously described. Operation then advances to query block 412 to determine whether WIN_LEN has reached zero or whether HC has exceeded the highest gain decrease threshold DEC_TH3. Initially, since WIN_LEN is set to non-zero value AGC_WIN_LEN and since HC is initialized to zero, this condition is false and operation advances to block 414 to initialize or otherwise update a set of count values HI_I, HI_Q, LO_I, and LO_Q as performed by the counter 304. HI_I is set equal to the DI_GT_THH signal which is logic "1" when the magnitude of the DI sample is greater than the upper threshold THH, HI_Q is set equal to the DQ_GT_THH signal which is logic "1" when the magnitude of the DQ sample is greater than the upper threshold THH, LO_I is set equal to the DI_LT_THL signal which is logic "1" when the magnitude of the DI sample is less than the lower threshold THL, and LO_Q is set equal to the DQ_LT_THL signal which is logic "1" when the magnitude of the DQ sample is less than the lower threshold THL.

After the HI_I, HI_Q, LO_I, and LO_Q values are set at block 414, operation advances to block 416 in which the high count HC is incremented by HI_I plus HI_Q and the low count LC is incremented by LO_I plus LO_Q. Operation then advances to block 418 in which WIN_LEN is decremented by one and operation loops back to query block 412 to determine whether WIN_LEN has decremented down to zero or whether HC has risen above DEC_TH3. The loop defined by blocks 412, 414, 416, and 418 essentially describe operation of the counter 304 for determining the number of DI and DQ samples that are above THH and the number of DI and DQ samples that are below THL in the current count window. If WIN_LEN decrements to zero, then the loop exits as determined at block 412 since the current count window has completed and operation advances instead to query block 420. Alternatively, if HC exceeds DEC_TH3 before the current count window is completed, then the loop exits and operation advances to query block 420.

At query block 420, the gain controller 308 determines whether the high count HC is greater than DEC_TH3, such as by detecting whether the comparator COMP2 306 has asserted HC_GT_DEC_TH3. If so, operation advances to block 422 in which P_GAIN_IDX is set equal to the current gain index GAIN_IDX minus 3 (or GAIN_IDX−3). Otherwise, if HC is not greater than DEC_TH3, then operation instead advances to query block 424 in which the gain controller 308 determines whether HC is greater than DEC_TH2, such as by detecting whether the comparator COMP2 306 has asserted HC_GT_DEC_TH2. If so, operation advances to block 426 in which P_GAIN_IDX is set equal to the current gain index GAIN_IDX minus 2 (or GAIN_IDX−2). Otherwise, if HC is not greater than DEC_TH2, then operation instead advances to query block 428 in which the gain controller 308 determines whether HC is greater than DEC_TH1, such as by detecting whether the comparator COMP2 306 has asserted HC_GT_DEC_TH1. If so, operation advances to block 430 in which P_GAIN_IDX is set equal to the current gain index GAIN_IDX minus 1 (or GAIN_IDX−1).

Referring now to FIG. 5, if the high count HC is not greater than DEC_TH1 as determined at block 428, then operation advances to block 432 to determine whether the low count LC is greater than or equal to the gain increase threshold INC_TH, such as by detecting whether the comparator COMP2 306 has asserted LC_GTE_INC_TH. If LC_GTE_INC_TH is not asserted, then operation advances to block 434 in which NUM_LO_CNT is reset to zero, and then operation loops back to block 410 to begin a new count window without a wait delay. The new count window can begin immediately since the gain of the AFE 120 has not been changed.

If, however, LC_GTE_INC_TH is asserted such that LC is greater than or equal to INC_TH, then operation advances instead to block 436 in which NUM_LO_CNT is incremented, and then to query block 438 to determine whether NUM_LO_CNT has been incremented to be equal to MAX_LO_CNT. At this point, if the total number of DI and DQ samples that are below the lower threshold THL of the count window that has just completed is at least INC_TH as determined at block 423, then NUM_LOW_CNT is incremented. As previously described, NUM_LOW_CNT is used to count the number of consecutive windows in which the low count LC is greater than or equal to the INC_TH. If the number of count windows has not yet reached MAX_LOW_CNT, then operation loops back to block 410 to begin a new count window without a wait delay. Again, the new count window can begin immediately since the gain of the AFE 120 has not been changed.

If, however, NUM_LOW_CNT has reached MAX_LOW_CNT as determined at block 438, then operation instead proceeds instead to block 440 in which the preliminary gain value P_GAIN_IDX is set equal to GAIN_IDX+1 in order to increase the gain. It is noted that MAX_LOW_CNT may be set to a relatively low number when the jammer detect circuit 122 does not detect a jammer signal in the communication medium, such as 1 for a single count window. When, however, the jammer detect circuit 122 does detect a jammer signal in the communication medium, then MAX_LOW_CNT may be dynamically increased. A higher value of MAX_LOW_CNT reduces the possibility of oscillation of the AGC loop.

If the high count HC has reached any of the thresholds DEC_TH, DEC_TH2 or DEC_TH3 as determined at blocks 420, 424, or 428 such that P_GAIN_IDX has been decreased by 1, 2, or 3 at blocks 422, 426 or 430, respectively, or if the LC is at least the threshold INC_TH for MAX_LOW_CNT consecutive window counts such that the P_GAIN_IDX has been increased by 1 at block 440, then operation advances to query block 442 to determine whether P_GAIN_IDX is less than the minimum gain index value MIN_GAIN_IDX. If so, then operation advances to block 444 to set P_GAIN_IDX equal to MIN_GAIN_IDX. After either blocks 442 or 444, operation advances to query block 446 to determine whether P_GAIN_IDX instead is greater than the maximum gain index value MAX_GAIN_IDX. If so, then operation advances to block 448 to set P_GAIN_IDX equal to MAX_GAIN_IDX. Blocks 442, 444, 446, and 448 ensure that the GAIN_IDX is not subsequently adjusted outside the predetermined minimum and maximum index values of the gain table 310.

After either blocks 446 or 448, operation advances to query block 450 to determine whether P_GAIN_IDX is equal to GAIN_IDX. In this case, if P_GAIN_IDX has not been decreased at blocks 422, 426, or 430, or has not been increased at block 440, or if the GAIN_IDX has already reached the minimum value MIN_GAIN_IDX or the maximum value MAX_GAIN_IDX, then the gain of AFE 120 is not adjusted and operation loops back to block 434 to reset NUM_LO_CNT 434 back to zero, and then back to block 410 to begin a new count window without a wait delay. On the other hand, if P_GAIN_IDX has been adjusted either up or down, then operation proceeds instead to block 452 to set WAIT_LEN equal to AGC_WAIT_LEN or to a value based on the difference between P_GAIN_IDX and GAIN_IDX. In this case, the wait time can be adjusted depending upon any one or more of several factors, such as the settling time of the gain change of the AFE 120, the amount of the gain change of the AFE 120, etc. For example, a longer wait time may be achieved by increasing WAIT_LEN to allow for longer settling time or a shorter wait time may be achieved by decreasing WAIT_LEN. After WAIT_LEN is reset or otherwise adjusted, operation advances to block 454 in which GAIN_IDX is set equal to P_GAIN_IDX to actually adjust the gain of the AFE 120 by applying an updated gain index to the gain table 310 (which correspondingly updates the gain values G_LNA, G_BBA, etc.). After the gain is adjusted, operation loops back to block 404 in which WAIT is once again asserted and a wait period is commenced based on the value of WAIT_LEN as previously described before starting the next count window. Operation continues in this manner while the communication system 100 is operative and actively receiving and acquiring signals in the communication medium.

A communication system according to one embodiment includes an analog front end and an automatic gain controller. The analog front end includes at least one amplifier for amplifying a received analog signal, and an analog to digital converter that converts the analog signal to digital samples. The automatic gain controller includes comparator circuitry, counter circuitry, and a gain controller. The comparator circuitry compares each of the digital samples with an upper threshold and a lower threshold. The counter circuitry counts a high count number of the digital samples having magnitudes that are greater than the upper threshold during each count window and counts a low count number of the digital samples having magnitudes that are less than the lower threshold during the count window. The gain controller adjusts a gain of the at least one amplifier by an amount based on the high count number and the low count number.

The upper and lower thresholds may be based on a dynamic range of the analog to digital converter. The analog front end may be configured to receive Ultra Wide Band wireless signals. The length of the count window may be determined by a programmable window count value.

The communication system may include second comparator circuitry that compares the high count number of digital samples with multiple high count thresholds for reducing gain by a corresponding multiple different gain adjust amounts. In one embodiment, the second comparator circuitry compares the high count number of digital samples with a high count threshold, a mid count threshold that is less than the high count threshold, and a low count threshold that is less than the mid count threshold. In this case the gain controller reduces the gain by a first gain adjust amount when the high count number exceeds the high count threshold, or the gain controller reduces the gain by a second gain adjust amount when the high count number exceeds the mid count threshold but does not exceed the high count threshold in which the second gain adjust amount is less than the first gain adjust amount, or the gain controller reduces the gain by a third gain adjust amount when the high count number exceeds the low count threshold but does not exceed the mid count threshold in which the third gain adjust amount is less than the second gain adjust amount.

The second comparator circuitry may also compare the low count number of digital samples with a low count threshold, in which case the gain controller increases the gain of the at least one amplifier when the low count number of digital samples is at least the low count threshold. The second comparator circuitry may compare the low count number of digital samples with a low count threshold for each count window, in which case the gain controller may increases the gain when the low count number of digital samples exceeds the low count threshold for a selected number of consecutive count windows in which the selected number is at least one. The selected number may be dynamically programmable based on a presence of a jammer signal.

The automatic gain controller may insert a delay between each count window. A duration of the delay may be based on an amount of time to allow for gain settling between sequential count windows. The gain controller may include a gain table that selects a gain value based on a gain index value determined by the high count number and the low count number. The analog front end may include a mixer that separates the received analog signal into an in-phase signal and a quadrature phase signal, in which the analog to digital converter converts the in-phase signal into in-phase digital samples and converts the quadrature phase signal into quadrature phase digital samples. The comparator circuitry separately compares and the counter separately counts the in-phase digital samples and the quadrature phase digital samples for determining the high count number and the low count number.

A method according to one embodiment includes amplifying a received analog signal with at least one amplifier, converting the analog signal to digital samples, comparing each of the digital samples with an upper threshold and a lower threshold, counting a high count number of the digital samples having magnitudes that are greater than the upper threshold during each count window, counting a low count number of the digital samples having magnitudes that are less than the lower threshold during the count window, and adjusting a gain of the at least one amplifier by an amount based on the high count number and the low count number.

The method may include determining a length of the count window based on a programmable window count value. The method may include comparing the high count number of digital samples with multiple high count thresholds for reducing gain by one of corresponding gain adjust amounts. The method may include comparing the high count number of digital samples with a high count threshold, a mid count threshold that is less than the high count threshold, and a low count threshold that is less than the mid count threshold, in which case the method may include reducing the gain of the at least one amplifier by a first gain adjust amount when the high count number exceeds the high count threshold, reducing the gain by a second gain adjust amount when the high count number exceeds the mid count threshold but does not exceed the high count threshold in which the second gain adjust amount is less than the first gain adjust amount, and reducing the gain by a third gain adjust amount when the high count number exceeds the low count threshold but does not exceed the mid count threshold in which the third gain adjust amount is less than the second gain adjust amount.

The method may include comparing the low count number of digital samples with a low count threshold, and increasing the gain when the low count number of digital samples is at least the low count threshold. The method may include comparing the low count number of digital samples with a low count threshold for each count window, and increasing the gain when the low count number of digital samples exceeds the low count threshold for a selected number of consecutive count windows in which the selected number is at least one. The method may include dynamically adjusting the selected number based on a presence of a jammer signal.

The method may include inserting a delay between each count window in which a length of the delay may be based on one or more of several factors, such as an amount of time for gain settling between count windows, an amount of gain adjust, etc.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive logic or negative logic may be used in various embodiments in which the present invention is not limited to specific logic polarities, device types or voltage levels or the like. For example, logic states, such as logic low and logic high may be reversed depending upon whether the pin or signal is implemented in positive or negative logic or the like. In some cases, the logic state may be programmable in which the logic state may be reversed for a given logic function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A communication system, comprising:
   an analog front end comprising:
      at least one amplifier for amplifying a received analog signal; and
      an analog to digital converter that converts the analog signal to digital samples;
   an automatic gain controller comprising:
      first comparator circuitry that compares each of the digital samples with an upper threshold and a lower threshold;
      counter circuitry that counts a high count number of the digital samples having magnitudes that are greater than the upper threshold during each count window and that counts a low count number of the digital samples having magnitudes that are less than the lower threshold during the count window; and
      a gain controller that adjusts a gain of the at least one amplifier of the analog front end by an amount based on the high count number and the low count number.

2. The communication system of claim 1, wherein the upper threshold and the lower threshold are selected based on a dynamic range of the analog to digital converter.

3. The communication system of claim 1, wherein the analog front end is configured to receive Ultra Wide Band wireless signals.

4. The communication system of claim 1, wherein a length of the count window is determined by a programmable window count value.

5. The communication system of claim 1, further comprising second comparator circuitry that compares the high count number of digital samples with a plurality of high count thresholds for reducing gain by a corresponding plurality of different gain adjust amounts.

6. The communication system of claim 1, further comprising:
   second comparator circuitry that compares the high count number of digital samples with a high count threshold, a mid count threshold that is less than the high count threshold, and a low count threshold that is less than the mid count threshold; and
   wherein the gain controller reduces the gain by a first gain adjust amount when the high count number exceeds the high count threshold, wherein the gain controller reduces the gain by a second gain adjust amount when the high count number exceeds the mid count threshold but does not exceed the high count threshold in which the second gain adjust amount is less than the first gain adjust amount, and wherein the gain controller reduces the gain by a third gain adjust amount when the high count number exceeds the low count threshold but does not exceed the mid count threshold in which the third gain adjust amount is less than the second gain adjust amount.

7. The communication system of claim 1, further comprising second comparator circuitry that compares the low count number of digital samples with a low count threshold, wherein the gain controller increases the gain of the at least one amplifier when the low count number of digital samples is at least the low count threshold.

8. The communication system of claim 1, further comprising:
   second comparator circuitry that compares the low count number of digital samples with a low count threshold for each count window; and
   wherein the gain controller increases gain when the low count number of digital samples exceeds the low count threshold for a selected number of consecutive count windows in which the selected number is at least one.

9. The communication system of claim 8, wherein the selected number is dynamically programmable based on a presence of a jammer signal.

10. The communication system of claim 1, wherein the automatic gain controller inserts a delay between each of a plurality of consecutive count windows in which a length of the delay is based on a gain settling time between sequential count windows.

11. The communication system of claim 1, wherein the gain controller comprises a gain table that selects a gain value based on a gain index value determined by the high count number and the low count number.

12. The communication system of claim 1, wherein:
   the analog front end comprises a mixer that separates the received analog signal into an in-phase signal and a quadrature phase signal;
   wherein the analog to digital converter converts the in-phase signal into in-phase digital samples and converts the quadrature phase signal into quadrature phase digital samples; and
   wherein the first comparator separately compares and the counter separately counts the in-phase digital samples and the quadrature phase digital samples for determining the high count number and the low count number.

13. A method, comprising:
   amplifying a received analog signal with at least one amplifier;

converting the analog signal to digital samples;

comparing each of the digital samples with an upper threshold and a lower threshold;

counting a high count number of the digital samples having magnitudes that are greater than the upper threshold during each count window;

counting a low count number of the digital samples having magnitudes that are less than the lower threshold during the count window; and adjusting a gain of the at least one amplifier by an amount based on the high count number and the low count number.

14. The method of claim 13, further comprising determining a length of the count window based on a programmable window count value.

15. The method of claim 13, further comprising comparing the high count number of digital samples with a plurality of high count thresholds for reducing gain by a corresponding plurality of different gain adjust amounts.

16. The method of claim 13, further comprising:

comparing the high count number of digital samples with a plurality of thresholds including a high count threshold, a mid count threshold that is less than the high count threshold, and a low count threshold that is less than the mid count threshold; and wherein the adjusting a gain comprises:

reducing the gain of the at least one amplifier by a first gain adjust amount when the high count number exceeds the high count threshold, reducing the gain by a second gain adjust amount when the high count number exceeds the mid count threshold but does not exceed the high count threshold in which the second gain adjust amount is less than the first gain adjust amount, and reducing the gain by a third gain adjust amount when the high count number exceeds the low count threshold but does not exceed the mid count threshold in which the third gain adjust amount is less than the second gain adjust amount.

17. The method of claim 13, further comprising:

comparing the low count number of digital samples with a low count threshold; and wherein the adjusting a gain comprises increasing the gain when the low count number of digital samples is at least the low count threshold.

18. The method of claim 13, further comprising:

comparing the low count number of digital samples with a low count threshold for each count window; and wherein the adjusting a gain comprises increasing the gain when the low count number of digital samples is at least the low count threshold for a selected number of consecutive count windows in which the selected number is at least one.

19. The method of claim 18, further comprising dynamically adjusting the selected number based on a presence of a jammer signal.

20. The method of claim 13, further comprising inserting a delay between each of a plurality of consecutive count windows in which a length of the delay is based on a gain settling time between sequential count windows.

* * * * *